United States Patent [19]

Keene

[11] 4,370,573

[45] Jan. 25, 1983

[54] WAVE FORM TRANSITION SEQUENCE DETECTOR

[75] Inventor: Bruce C. Keene, Phoenix, Ariz.

[73] Assignee: Honeywell Information Systems Inc., Phoenix, Ariz.

[21] Appl. No.: 210,950

[22] Filed: Nov. 28, 1980

[51] Int. Cl.³ .............................................. H03K 5/26

[52] U.S. Cl. .................................... 307/514; 307/236; 307/518; 307/291

[58] Field of Search ............... 307/514, 516, 518, 291, 307/236

[56] References Cited

U.S. PATENT DOCUMENTS

| | | | |
|---|---|---|---|
| 2,874,313 | 2/1959 | Githens | 307/291 |
| 3,178,584 | 4/1965 | Clark | 307/291 |
| 3,304,496 | 2/1967 | Lorenz | 307/514 |
| 4,001,603 | 1/1977 | Wilcox | 307/516 |
| 4,112,296 | 9/1978 | Heimbigner et al. | 307/291 |

*Primary Examiner*—John S. Heyman
*Attorney, Agent, or Firm*—L. D. Burton; W. W. Holloway, Jr.; L. J. Marhoefer

[57] ABSTRACT

Two switching elements are cross-coupled in the standard bistable multivibrator arrangement. Two additional switching elements are added: one each in parallel with one of the switching elements forming the bistable multivibrator. The two wave forms under study are applied to the control gate of each of the additional switching elements. When both wave forms are in one state, the two additional switching elements are switched ON, effectively inhibiting bistable multivibrator action. The first wave form to change state results in its associated switching element switching OFF, which releases the bistable multivibrator circuit to assume the corresponding stable state, which observed differentially across the switching element forming the bistable multivibrator, is indicative of the wave form to first undergo transition. After the first wave form has undergone transition, the bistable multivibrator becomes insensitive to the subsequently occuring transition on the second wave form, and the circuit remains in the defined stable state until both wave forms again assume their previous state prior to transition, in which, once again, bistable multivibrator action is inhibited.

3 Claims, 4 Drawing Figures

WAVE FORM TRANSITION SEQUENCE DETECTOR

BACKGROUND OF THE INVENTION

1. Field of the Invention

The present invention relates to digital systems, and is more particularly concerned with determining on which of two given wave forms a transition first occurs.

2. Description of the Prior Art

In working with digital systems, it is often necessary to know the relationship between transitions in wave forms. More particularly, it is often necessary to determine which of two wave forms first undergoes a transition from a first state to a second state.

One area where the time relationship between wave form transitions is of value is in measuring the signal propagation time through a system. In such an arrangement, it is often desirable to have a simple means for monitoring the time relationship between transitions and thereby know which wave form first undergoes a transition.

In the past, such objects were achieved in various ways. One way was to have a clock source and a counter, with gating means so that the occurrence of a transition on one wave form would initiate the counter counting clock pulses, and the occurrence of the transition on the second wave form would halt the counting process. The value in the counter would then be indicative of the time relationship between the transition of the two wave forms.

An alternate method of ascertaining the time between transitions in two wave forms was to use either a dual trace oscilloscope, or a single trace oscilloscope with a means of triggering the trace from an external source, which in this application would be one of the two wave forms. The time relationship between the two wave forms could then be directly observed on the oscilloscope screen.

However, both of the above-described methods, as well as the many other techniques, often suffer from the requirement of various amounts of highly complex and expensive equipment. In addition to this, when the time between the transitions becomes very small, typically in the sub-nanosecond range, the speed at which the equipment can operate can begin to limit the effectiveness of the observance and measurability of the events.

SUMMARY OF THE INVENTION

The wave form transition sequence detector made the subject of the present application is characterized by a relatively simple circuit which will detect which of two wave forms first undergoes a transition. The circuit basically consists of two cross-coupled switching elements in the common bistable multivibrator arrangement, with two additional switching elements acting as control elements such that each switching element in the bistable multivibrator has in parallel with it one of the two additional switching elements. By applying the signal wave forms under examination to the control elements, the bistable multivibrator action is inhibited until an appropriate transition occurs on one of the inputs. This releases the bistable multivibrator to assume a state defined by the occurrence of the first wave form transition, and the circuit remains in that stable state until both wave forms have returned to the previous state prior to transition. In this condition, bistable multivibrator action is again inhibited until the occurrence of the next appropriate transition.

A primary object of the present invention is to provide a circuit to detect which of the two wave forms undergoes a transition first.

A further object of the present invention is to provide a relatively inexpensive and simple circuit for the detection of which of two wave forms changes levels first.

A still further object of the present invention is to provide a relatively simple and inexpensive circuit which will detect which of two wave forms undergoes a transition first, with the ability to resolve transition time differences in the sub-nanosecond range.

The foregoing and other objects, features and advantages of the invention will be apparent from the following more particular description of a disclosed embodiment of the invention, as illustrated in the accompanying drawings.

DESCRIPTION OF DRAWINGS

FIG. 3 is a timing diagram showing the Reference Input, the Test Input, and the corresponding relative wave form potential on transistor Q2 collector relative to transistor Q3 collector, for the case when the Reference Input leads the Test Input.

FIG. 4 is a timing diagram showing the Reference Input, the Test Input, and the corresponding relative wave form potential on transistor Q2 collector relative to transistor Q3 collector for the case when the Reference Input lags the Test Input.

DESCRIPTION OF PREFERRED EMBODIMENT

Figures 1, 2:
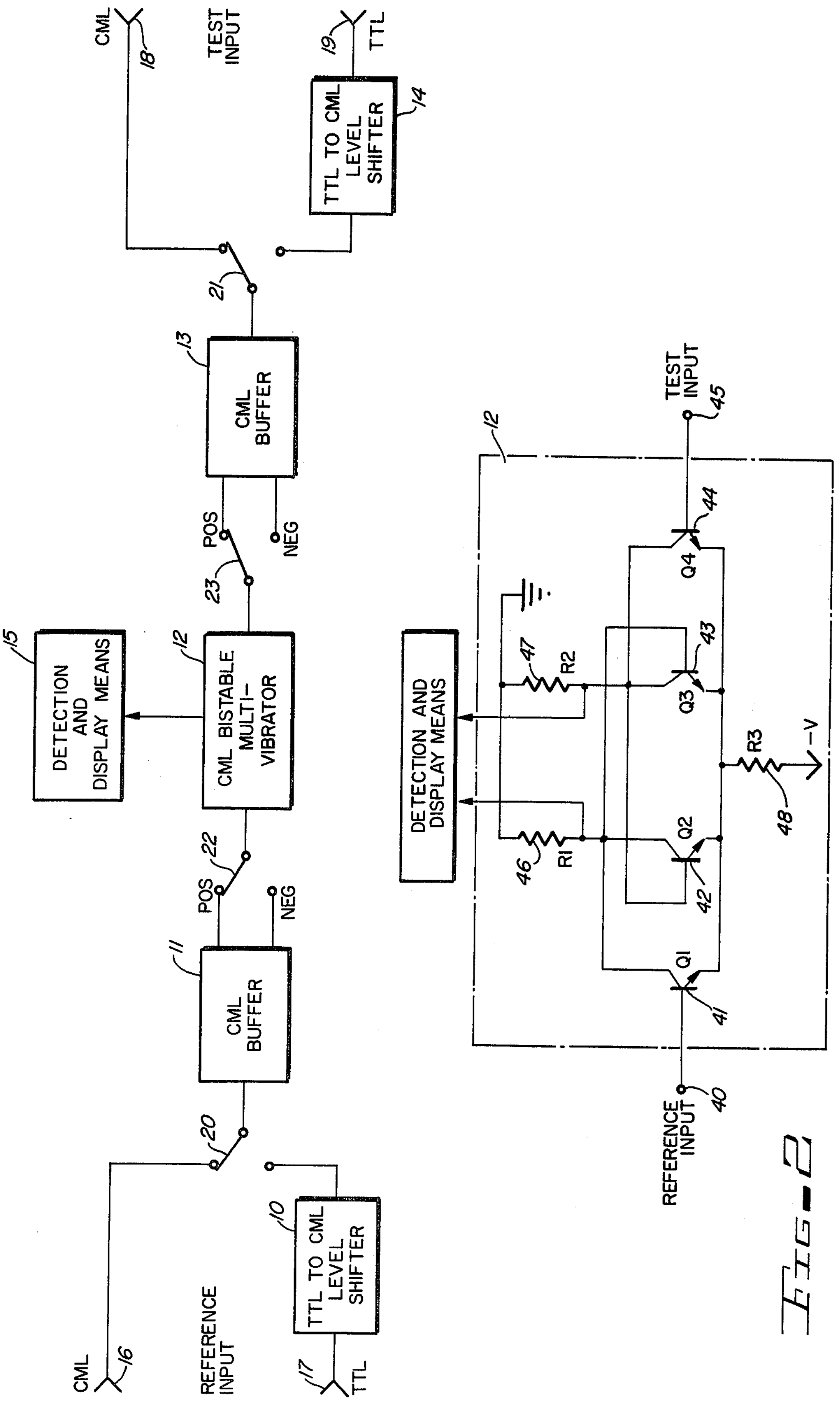
FIG. 1 is a block diagram of an illustrated embodiment of the invention, with accompanying elements to add flexibility to the invention.
FIG. 2 is a schematic of an illustrated embodiment of the invention implemented using transistors arranged in a current mode logic circuit.

In FIG. 1, a block diagram of the circuit is shown. The inventive concept herein is shown as current mode logic (CML) bistable multivibrator 12. The other items shown are additional features to add flexibility and convenience to the present invention.

The two inputs to the circuit are the Reference Inputs 16 or 17 and the Test Inputs 18 or 19. In the disclosed embodiment, the present invention detects coincidence or lack thereof between input wave forms implemented with current mode logic, hereinafter referred to as CML, or transistor transistor logic, hereinafter referred to as TTL. Inputs 16 and 18 are the inputs used for wave forms implemented with CML for the Reference Input and Test Input respectively. Inputs 17 and 19 are the inputs used for wave forms implemented with TTL for the Reference Input and Test Input respectively. Inputs 17 and 19 connect with a TTL to CML level shifter circuit 10 and 14 for conversion of the TTL level to CML level. Switches 20 and 21 are to be set to coincide with the logic levels of the respective input wave forms.

As will be discussed later, the disclosed embodiment responds only to high to low transitions. Consequently, the CML buffers 11 and 13, while providing isolation between the input signal source and the CML bistable multivibrator, also provide the flexibility to observe low to high transitions for the respective Reference and Test Input wave forms.

The CML bistable multivibrator 12 detects coincidence or lack thereof and is the essence of the present invention.

Detection and Display means 15 indicates on which input, i.e., the Reference Input or Test Input, a transition first occurred.

FIG. 2 is a schematic of the preferred embodiment. It will be observed that transistors Q2 42 and Q3 43 form the basic bistable multivibrator circuit. It will also be observed that transistors Q1 41 and Q4 44 are connected across the collector and emitters of transistors Q2 42 and Q3 43 respectively. With this arrangement, when tranistors Q1 41 and Q4 44 are in the ON or conducting state, said transistors act as an effective short circuit between the collectors and emitters of transistors Q2 42 and Q3 43 respectively, and inhibit said transistors Q2 42 and Q3 43 from operating as a bistable multivibrator in the convention fashion. In this state, current will flow through the collector resistor R1 46 and R2 47, through transistors Q1 41 and Q4 44, and finally through the common emitter resistor R3 48. It will be observed that, in this state, both transistors Q2 42 and Q3 43 are in the OFF or nonconducting state, due to the potential on the base of each of said transistors.

Figure 4:
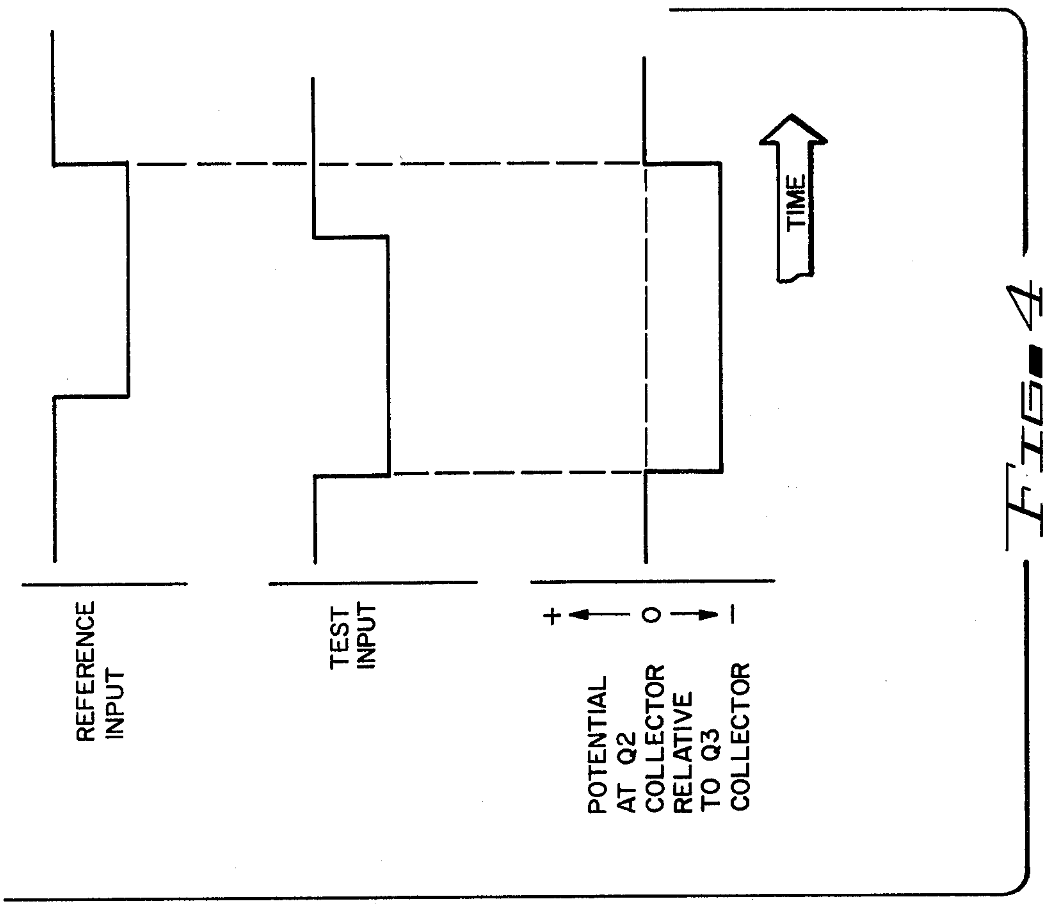
FIGS. 3 and 4 are timing diagrams showing the two inputs to the illustrated embodiment of FIG. 2.
Figure 3:
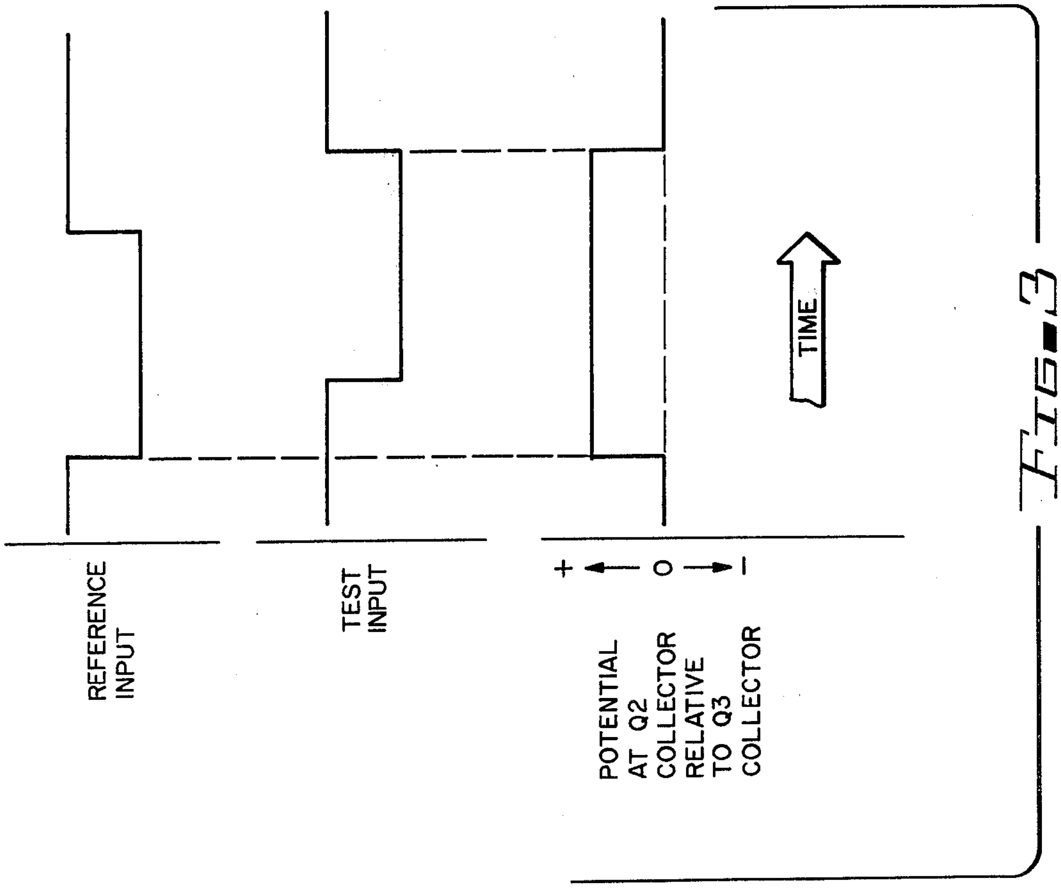

FIG. 3 and FIG. 4 illustrate the two possible cases of noncoincidence of the Reference Input and Test Input wave forms, i.e., the Reference Input leading and lagging the Test Input.

In FIG. 3, the Reference Input changes from a high state to a low state before the Test Input does so. The following will consider the effect of such an occurrence on the circuit shown in FIG. 2.

During the time period when both the Reference Input and the Test Input are both in the high state, transistors Q1 41 and Q4 44 will both be in the ON state, effectively inhibiting the bistable multivibrator action between transistors Q2 42 and Q3 43. When the Reference Input makes the transistion from the high to low state, thereafter transistor Q1 41 will be in the OFF or nonconducting state. Consequently, the effective short circuit formed by transistor Q1 41 while in the conducting state will have been removed from transistor Q2 42. However, as the Test Input is still in the high state, transistor Q4 44 will still be in the conducting state, resulting in the collectors of transistors Q3 43 and Q4 44, and the base of transistor Q2 42 being at a negative potential, as determined by the current through collector resistor R2 47 and the common emitter resistor R3 48. The base of transistor Q2 42 being at a negative potential will bias transistor Q2 42 into the OFF or nonconducting state. Consequently, the collector of transistor Q2 42 will be at essentially ground potential, which will in turn bias transistor Q3 43 into the ON or conducting state. With transistor Q3 43 in the ON or conducting state, the bistable multivibrator circuit formed by transistors Q2 42 and Q3 43 will assume a stable state with transistor Q2 42 in the OFF or nonconducting state and transistor Q3 43 in the ON or conducting state, regardless of the condition of the Test Input. This result naturally follows due to the fact that when the Test Input changes from a high to a low state, the only effect will be to turn transistor Q4 44 OFF. This will in no way disturb the state of the bistable multivibrator circuit formed by transistors Q2 42 and Q3 43 because the individual base potentials of transistors Q2 42 and Q3 43 are, at this point in time, in no way dependent upon the state of transistor Q4 44. The essentially ground potential at the base of transistor Q3 43 which biases transistor Q3 43 into the ON or conducting state is set by the collector potential of transistor Q2 42, which is in the OFF or nonconducting state. With transistor Q3 43 in the ON or conducting state, the collector to emitter voltage drop across transistor Q3 43 is essentially zero, and consequently the negative potenial appearing at transistor Q3 43 collector by virtue of the R2–R3 47 48 voltage divider formed thereby biases transistor Q2 42 into the OFF or nonconducting state. Consequently, the circuit of FIG. 2 will remain in this state after the Test Input changes state from the high to low state, as shown in FIG. 3. The bistable multivibrator circuit will remain in this state until both the Reference Input and the Test Input again change to the high state, thereby again biasing transistors Q1 41 and Q4 44 into the ON or conducting state, effectively placing a short circuit across transistors Q2 42 and Q3 43, and inhibiting the assumption of a bistable state. It should be observed that the Reference Input, by making the high to low transition before the Test Input changes from high to low state, permits the circuit of FIG. 2 to assume one of its two bistable state in which it will remain until it is removed therefrom by both the Reference Input and the Test Input both returning to the high state.

In summary, it will be observed, as shown in FIG. 3, that with both the Reference Input and Test Input in the high state, an equal amount of current is flowing through collector resistors R1 46 and R2 47, and consequently the differential potential at transistor Q2 42 collector relative to transistor Q3 43 collector is zero. However, when the Reference Input changes from a high to a low state, the differential potential at transistor Q2 42 collector relative to transistor Q3 43 collector becomes positive, and remains positive until both the Reference Input and Test Input return to their high state.

In a similar fashion, FIG. 4 depicts the case when the Test Input changes from a high state to a low state prior to the Reference Input changing from a high state to a low state. The following will consider the effects of such an occurrence on the circuit shown in FIG. 2.

During the time period when the Test Input and the Reference Input are both in the high or conducting state, transistors Q4 44 and Q1 41 will both be in the ON or conducting state, effectively inhibiting the bistable multivibrator action between transistors Q2 42 and Q3 43. When the Test Input changes from the high to low state, thereafter transistor Q4 44 will be in the OFF or nonconducting state. Consequently, the effective short circuit formed by transistor Q4 44 while in the conducting state will have been removed from transistor Q3 43. However, as the Reference Input is still in the high state, transistor Q1 41 will still be in the conducting state, resulting in the collectors of transistors Q1 41 and Q2 42, and the base of transistor Q3 43 being at a negative potential, as determined by the current through collector resistor R1 46 and the common emitter resistor R3 48. The base of transistor Q3 43 being at a negative potential will bias transistor Q3 43 into the OFF or nonconducting state. Consequently, the collector of transistor Q3 43 will be at essentially ground potential, which will in turn bias transistor Q2 42 into the ON or conducting state. With transistor Q2 42 in the ON or conducting state, the bistable multivibrator circuit formed by transistors Q2 42 and Q3 43 will assume a stable state with transistor Q2 42 in the ON or conducting state and transistor Q3 43 in the OFF or nonconducting state, regardless of the condition of the Reference Input. When the Reference Input changes from a high to a low state, the only effect will be to turn transistor Q1 41 OFF. This will in no way disturb the state of the bistable multivibrator circuit formed by transistors Q2 42 and Q3 43 because the individual base potentials of transistors Q2 42 and Q3 43 are, at this point in time, in no way dependent upon the state of transistors Q1 41. The essentially ground potential at the base of transistors Q2 42 which biases transistor Q2 42 into the ON or conducting state is set by the collector potential of transistor Q3 43, which is in the OFF or nonconducting state. With transistor Q2 42 in the ON or conducting state, the collector to emitter voltage drop across transistor Q2 42 is essentially zero, and consequently the negative potential appearing at transistor Q2 42 collector by virtue of the R1-R3 46-48 voltage divider formed thereby biases transistor Q3 43 into the OFF or nonconducting state. Consequently, the circuit of FIG. 2 will remain in this state after the Reference Input changes state from the high to low state, as shown in FIG. 4. The said bistable multivibrator circuit of FIG. 2 will remain in this state until both the Reference Input and the Test Input both again return to the high state, thereby again biasing transistors Q1 41 and Q4 44 into the ON or conducting state, effectively placing short circuits across transistors Q2 42 and Q3 43, and thereby inhibiting the assumption of a bistable state. It should again be observed that the Test Input, by changing from a high to low state before the Reference Input changes from a high to a low state, permits the circuit of FIG. 2 to assume one of its two bistable states in which it will remain until it is removed therefrom by both the Reference Input and the Test Input again returning to the high state.

In summary, it will be observed, as shown in FIG. 4, that with both the Reference Input and Test Input in the high state, an equal amount of current is flowing through collector resistors R1 46 and R2 47, and consequently the differential potential at transistor Q2 42 collector relative to transistor Q3 43 collector is zero. However, when the Test Input changes from a high to low state, the differential potential at transistor Q2 42 collector relative to transistor Q3 43 collector becomes negative, and remains negative until both the Reference Input and the Test Input return to their high state.

Consequently, in summary, it will be observed in the preferred embodiment that when both the Reference Input and the Test Input are both in the high state, bistable multivibrator action between transistors Q2 42 and Q3 43 is inhibited, and the first input, either the Reference Input or the Test Input, to change from the high state to the low state will result in the bistable multivibrator circuit formed by transistors Q2 42 and Q3 43 assuming one of its two stable states. The stable state the bistable multivibrator assumes, as observed by the differential potential at Q2 42 collector relative to Q3 43 collector, will be defined by which of the two inputs changes from the high to the low state first: the differential potential at transistor Q2 42 collector relative to transistor Q3 43 collector will be positive if the Reference Input leads the Test Input, and negative if the Reference Input lags the Test Input. Thereafter, the state of the bistable multivibrator cannot be changed until both the Reference Input and the Test Input again change back to the high state.

The respective collectors of transistors Q2 42 and Q3 43 are connected to a detection circuit to detect and indicate the said differential potential at transistor Q2 42 collector relative to transistor Q3 43 collector, and so indicate which input, the Reference Input or the Test Input, first undergo a change in state. Such a detection circuit can be implemented in a myriad of ways, all well known to one skilled in the art.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. Apparatus for determining the relative order of occurrence of a transition from a first to a second state between a first and a second input wave form signal, said apparatus comprising:

a first switching transistor means having base, emitter and collector electrodes;

a second switching transistor means having base, emitter and collector electrodes;

means connecting said collection of said first transistor means to said base electrode of said second transistor means and means connecting said collector of said second transistor means to said base electrode of said first transistor means;

a third and a fourth transistor means, each having base, emitter and collector electrodes;

means connecting said collector of said third transistor means to said collector of said first transistor means and, through a first load resistor, to a first common point fixed reference potential;

means connecting said collector of said fourth transistor means to said collector of said second transistor means and, through a second load resistor, to said first common point;

means connecting said emitters of said first, second, third and fourth transistor means together and, through a common emitter resistor, to a second common point of reference potential;

means coupling said first input wave form signal to said base electrode of said third transistor means and means coupling said second input wave form signal to said base electrode of said fourth transistor means;

differential output signal means connected, respectively, to said collectors of said first and second transistor means; and detector means connected to said output signal means for determining the relative polarity of the differential output signal as an indication of said relative order of occurrence a transition of state between said first and second wave form signal.

2. Apparatus as set forth in claim 1 wherein said first common point of fixed reference potential is at a positive potential with respect to said second common point of reference potential.

3. Apparatus for determining the relative order of occurrence of transitions in signal level state in a first and a second input wave form signal, said apparatus comprising:

a pair of transistor means cross-coupled to provide a bistable transistor unit;

a third transistor connected to selectively provide a short-circuit path across one transistor of said pair;

a fourth transistor connected to selectively provide a short-circuit path across the other transistor of said pair;

said third and fourth transistors each having a control electrod to control the respective short-circuit paths;

means coupling said first input wave form signal to said control electrode of said third transistor and means coupling said second input wave form signal to said control electrode of said fourth transistor to control the selective actuation of said respective short-circuit paths, said short-circuit paths, when actuated, inhibiting the bistable actuation of said bistable transistor unit; and detector means connected to said bistable transistor unit to detect the state of actuators of said bistable transistor unit as a function of the relative order of occurrence transistions in signal level state in said first and second input wave form signals.

* * * * *